(12) United States Patent
Hirotsuru et al.

(10) Patent No.: US 8,890,189 B2
(45) Date of Patent: Nov. 18, 2014

(54) WAFER FOR LED MOUNTING, METHOD FOR MANUFACTURING SAME, AND LED-MOUNTED STRUCTURE USING THE WAFER

(75) Inventors: Hideki Hirotsuru, Fukuoka (JP); Yosuke Ishihara, Fukuoka (JP); Hideo Tsukamoto, Fukuoka (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 88 days.

(21) Appl. No.: 13/387,606

(22) PCT Filed: Jul. 29, 2010

(86) PCT No.: PCT/JP2010/062808
§ 371 (c)(1),
(2), (4) Date: Mar. 14, 2012

(87) PCT Pub. No.: WO2011/013754
PCT Pub. Date: Feb. 3, 2011

(65) Prior Publication Data
US 2012/0168802 A1    Jul. 5, 2012

(30) Foreign Application Priority Data

Jul. 31, 2009 (JP) .................................. 2009-179275

(51) Int. Cl.
*H01L 33/60* (2010.01)
*C04B 41/52* (2006.01)
(Continued)

(52) U.S. Cl.
CPC ............ *C04B 35/565* (2013.01); *B22F 2998/10* (2013.01); *H01L 33/0079* (2013.01); *C04B 41/52* (2013.01); *C04B 2235/427* (2013.01); *C04B 2235/5436* (2013.01); *H01L 33/641* (2013.01); *C04B 2235/5472* (2013.01); *C22C 29/065* (2013.01); *H01L 33/60* (2013.01); *C22C 26/00* (2013.01); *C04B 2235/3826* (2013.01); *C22C 1/1094* (2013.01); *C04B 41/009* (2013.01); *C04B 35/52* (2013.01); *C22C 29/16* (2013.01); *C22C 1/1036* (2013.01); *C04B 2235/5427* (2013.01); *C04B 41/90* (2013.01)
USPC ........................................................ 257/98

(58) Field of Classification Search
CPC ....................................................... H01L 33/60
USPC ............................................. 257/98; 438/106
See application file for complete search history.

(56) References Cited

U.S. PATENT DOCUMENTS 6,447,894 B1 * 9/2002 Hirotsuru et al. .......... 428/307.7
2003/0141506 A1    7/2003 Sano et al.
(Continued)

FOREIGN PATENT DOCUMENTS

CN          1748327 A       3/2006
EP        2 397 455 A1     12/2011
(Continued)

OTHER PUBLICATIONS
Extended European Search Report issued Nov. 23, 2012 in European Patent Application No. 10804500.6.
(Continued)

*Primary Examiner* — Yu Chen
*Assistant Examiner* — Warren H Kilpatrick
(74) *Attorney, Agent, or Firm* — Oblon, Spivak, McClelland, Maier & Neustadt, L.L.P.

(57) ABSTRACT

Provided is a wafer for LED mounting having a small difference in thermal expansion coefficient from an LED and having excellent heat conductivity, a method for manufacturing the wafer for LED mounting, and an LED-mounted structure manufactured by using the wafer for LED mounting. The wafer for LED mounting (6) is constituted of a metal infiltrated ceramic composite (61) and a protective layer (62) that is formed therearound. The metal infiltrated ceramic composite (61) preferably has a thin metal layer (63) on a surface thereof. The method for manufacturing the wafer is characterized by comprising filling at least one selected from the group consisted of porous ceramic bodies, ceramic powder compacts and ceramic powders into a tubular body made of metal or ceramic, then impregnating a metal into the void of at least one selected from the group consisted of porous ceramic bodies, ceramic powder compacts and ceramic powders, and thereafter performing a process.

19 Claims, 6 Drawing Sheets

(51) Int. Cl.
*C04B 35/565* (2006.01)
*C22C 29/06* (2006.01)
*C22C 26/00* (2006.01)
*C22C 1/10* (2006.01)
*C04B 41/00* (2006.01)
*C04B 35/52* (2006.01)
*C22C 29/16* (2006.01)
*C04B 41/90* (2006.01)
*H01L 33/00* (2010.01)
*H01L 33/64* (2010.01)

(56) References Cited

U.S. PATENT DOCUMENTS

| | | | |
|---|---|---|---|
| 2006/0118808 | A1 | 6/2006 | Ishidu et al. |
| 2007/0122994 | A1 | 5/2007 | Sonobe et al. |
| 2007/0295951 | A1 | 12/2007 | Chyi et al. |
| 2009/0127567 | A1* | 5/2009 | Wang ............................. 257/79 |
| 2010/0319900 | A1* | 12/2010 | Abyzov ........................ 165/185 |
| 2011/0316038 | A1 | 12/2011 | Hirotsuru et al. |
| 2011/0316040 | A1 | 12/2011 | Hirotsuru et al. |

FOREIGN PATENT DOCUMENTS

| | | | |
|---|---|---|---|
| EP | 2 398 081 A1 | 12/2011 | |
| JP | 5 73252 | 10/1993 | |
| JP | 6 155253 | 6/1994 | |
| JP | 6 295848 | 10/1994 | |
| JP | 11-130568 A | 5/1999 | |
| JP | 2001 105124 | 4/2001 | |
| JP | 2004-288788 A | 10/2004 | |
| JP | 2005 117006 | 4/2005 | |
| JP | 2006 128710 | 5/2006 | |
| JP | 2007 5709 | 1/2007 | |
| JP | 2007 142479 | 6/2007 | |
| JP | 2007 150076 | 6/2007 | |
| JP | 2007 250979 | 9/2007 | |
| JP | 2008 10809 | 1/2008 | |
| JP | 2008 294482 | 12/2008 | |
| JP | 2009-123829 A | 6/2009 | |

OTHER PUBLICATIONS

Mark A. Occhionero, et al., "AlSiC, and AlSiC Hybrid Composites for Flip Chips, Optoelectronics, Power, and High Brightness LED Thermal Management Solutions", 6$^{th}$ International Conference on Electronic Packaging Technology, XP010869500, Aug. 30, 2005, 5 pages.

International Search Report Issued Aug. 31, 2010 in PCT/JP10/62808 Filed Jul. 29, 2010.

* cited by examiner

US 8,890,189 B2

WAFER FOR LED MOUNTING, METHOD FOR MANUFACTURING SAME, AND LED-MOUNTED STRUCTURE USING THE WAFER

This application is a 371 of PCT/JP2010/062808, filed Jul. 29, 2010. Priority to Japanese patent application 2009-179275, filed Jul. 31, 2009, is claimed.

TECHNICAL FIELD

The present invention relates to a wafer for LED mounting, a method for manufacturing the wafer and an LED-mounted structure using the wafer.

BACKGROUND ART

A light-emitting diode (LED) is an element that emits light when a forward current passes through the pn junction of a semiconductor, and is manufactured using a Group III-V semiconductor crystal such as GaAs or GaN. In recent years, through advances in epitaxial growth technology for semiconductors and light-emitting element processing technology, LEDs with excellent conversion efficiency have been developed and widely used in various fields.

An LED is composed of a p-type layer and an n-type layer formed by epitaxially growing a Group III-V semiconductor crystal on a monocrystalline growth substrate, and a photoactive layer sandwiched between the two. In general, they are formed by epitaxially growing a Group III-V semiconductor crystal on a growth substrate such as a monocrystalline sapphire, then attaching electrodes thereto (Patent Document 1).

In cases where a Group III-V semiconductor crystal is epitaxially grown on a monocrystalline growth substrate, since the monocrystalline growth substrate and Group III-V semiconductor crystal have different lattice constants, it is difficult to grow a good LED. For this reason, a method of forming a buffer layer such as GaN on a monocrystalline growth substrate at a low temperature, and then epitaxially growing GaN thereon has been proposed (Patent Document 2).

On the other hand, there is the problem of poor thermal conductivity of monocrystalline growth substrates. In the case of monocrystalline sapphire, the thermal conductivity is approximately 40 W/mK, and the heat generated by a Group III-V semiconductor element cannot be sufficiently dissipated. In particular, for high-output LEDs where a large electrical current passes through, there are problems of increased temperature of the elements, reduced luminescent efficiency and reduced lifespan of the elements. For this reason, a method of epitaxially growing a Group III-V semiconductor crystal on a monocrystalline growth substrate, then joining it with a highly thermal conductive substrate via a metal layer, and then removing the monocrystalline growth substrate has been proposed (Patent Document 3). In this case, as the highly thermal conductive substrate, materials such as copper that have excellent thermal conductivity have been examined, but the difference in thermal expansion coefficient with Group III-V semiconductor crystals is large, and their use in high-output LEDs has not been sufficiently satisfactory.

Patent Document 1: JP-A 2005-117006
Patent Document 2: JP-B H5-73252
Patent Document 3: JP-A 2006-128710

SUMMARY OF THE INVENTION

The object of the present invention is to provide a wafer for LED mounting which has a small difference in thermal expansion coefficient from LEDs and excellent thermal conductivity, a method for manufacturing the wafer for LED mounting, and an LED-mounted structure manufactured using the wafer for LED mounting.

The present invention is a wafer for LED mounting (hereafter simply referred to as the "wafer") 6, characterized by consisting of a metal infiltrated ceramic composite 61 and a protective layer 62 formed around it (see FIG. 1).

In the wafer of the present invention, the metal infiltrated ceramic composite comprises at least one selected from silicon carbide, aluminum nitride, silicon nitride, diamond and graphite, is formed by impregnating a porous body or powder compact having a porosity of 10 to 50 volume % with a metal, and preferably has a plate thickness of 0.05 to 0.5 mm, a surface roughness (Ra) of 0.01 to 0.5 µm, a three-point bending strength of at least 50 MPa, a thermal conductivity of 150 to 500 W/mK at a temperature of 25° C., a thermal expansion coefficient of 4 to $9 \times 10^{-6}$/K from a temperature of 25° C. to 150° C., and a volume resistivity of $10^{-9}$ to $10^{-5}$ Ω·m.

Additionally, in the wafer of the present invention, the protective layer consists of at least one metal selected from Ni, Co, Pd, Cu, Ag, Au, Pt, Ti, W and Mo, or at least one ceramic selected from alumina, mullite, aluminum nitride and silicon nitride having a porosity of at most 3%, the thickness of the protective layer is preferably at most 3 mm (not including 0), and the volume occupancy of the protective layer is preferably at most 20 volume % (not including 0).

Further, in the wafer of the present invention, the metal infiltrated ceramic composite 61 preferably has, on a surface, a thin layer 63 of a thickness of 0.5 to 10 µm and of at least one metal selected from Ni, Co, Pd, Cu, Ag, Au, Pt and Sn (see FIG. 4). The thickness of the thin metal layer is preferably 0.5 to 10 µm; if it is less than 0.5 µm, the effect of enhancing chemical resistance may be poor, and if it exceeds 10 µm, surface roughness may be increased. The thin metal layer is formed by plating, such as non-electrolytic plating or electrolytic plating, or by vapor deposition etc.

Additionally, the present invention is a method for manufacturing the wafer of the present invention, comprising steps of loading into a metal or ceramic tubular body at least one selected from a porous ceramic body, a ceramic powder compact and a ceramic powder, then impregnating the pore of the at least one selected from a porous ceramic body, a ceramic powder compact and a ceramic powder with a metal, and then processing it.

Moreover, the present invention is a method for manufacturing the wafer of the present invention, comprising steps of impregnating the pore of a porous ceramic body or a ceramic powder compact with a metal, and then processing it after forming a protective layer on sides thereof, or forming a protective layer after processing.

In addition, the present invention is an LED-mounted structure, characterized by sequentially having, on at least a surface of a substrate for LED mounting 5 consisting of at least a piece cut out from a part of the metal infiltrated ceramic composite 61 of the wafer of the present invention, a thin metal layer 51 (or a thin metal layer 51 and a metal layer 31 of a reflective layer), a reflective layer 3, an LED 2 and a transparent conductive layer 4, an electrode (not shown) being attached on the transparent conductive layer 4 (see FIG. 3 and FIG. 6).

According to the wafer of the present invention, one with a small difference in thermal expansion coefficient from LEDs is provided. At least a piece is cut out from a part of the metal infiltrated ceramic composite constituting the wafer of the present invention to form a substrate for LED mounting. Moreover, an LED is mounted on the substrate for LED mounting to form an LED-mounted structure. Additionally, the wafer of the present invention has excellent chemical resistance against acids and alkalis used during the manufacture of the LED-mounted structure of the present invention, and allows for easy formation of electrodes because of the high conductivity. Further, the LED-mounted structure of the present invention is one with high output and has excellent heat dissipation and reliability, and it is possible to increase the amount of luminescence per unit area. According to the method for manufacturing a wafer of the present invention, the wafer of the present invention can be easily manufactured.

DESCRIPTION OF REFERENCE NUMBERS

Figure 1:
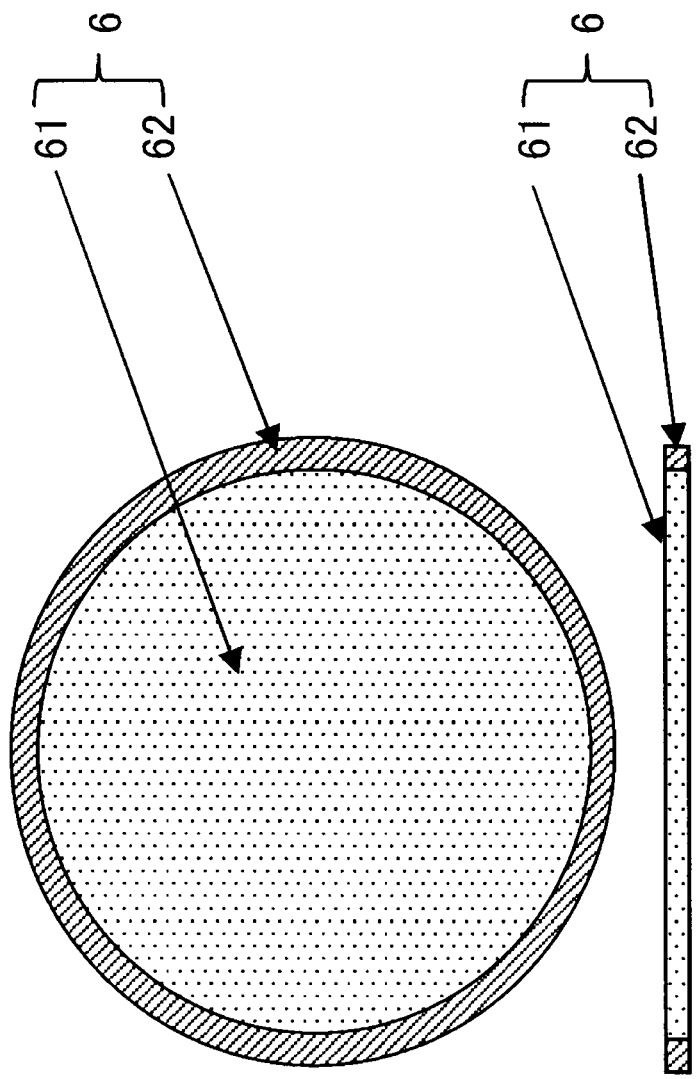
FIG. 1 is a diagram of a wafer of the present invention manufactured in Example 1.

1 Monocrystalline growth substrate
11 N-type Group III-V semiconductor buffer layer on a surface of monocrystalline growth substrate 1
12 Surface coating layer of an inorganic compound on a surface of monocrystalline growth substrate 1
2 LED
21 N-type Group III-V semiconductor layer of LED 2
22 Luminescent layer of LED 2
23 P-type Group III-V semiconductor layer of LED 2
3 Reflective layer
31 Metal layer on a surface of reflective layer 3
4 Transparent conductive layer
5 Substrate for LED mounting
51 Metal foil layer on a surface of substrate for LED mounting 5
6 Wafer
61 Metal infiltrated ceramic composite of wafer 6
62 Protective layer of wafer 6
63 Thin metal layer on a surface of metal infiltrated ceramic composite 61

MODES FOR CARRYING OUT THE INVENTION

The LED-mounted structure of the present invention can be manufactured via, for example, the following steps: epitaxially growing an LED on a surface of a monocrystalline growth substrate (step a), joining it with the wafer of the present invention to produce a joined body (step b), removing the monocrystalline growth substrate part from the joined body to produce an intermediate structure (step c), and forming a transparent conductive layer and electrode etc. on the intermediate structure and then cutting it (step d). Herebelow, it shall be explained with reference to the drawings.

(Step a) This step is a step of epitaxially growing an LED on a surface of a monocrystalline growth substrate. Specifically, after forming an n-type Group III-V semiconductor buffer layer 11 or a surface coating layer 12 of an inorganic compound on a surface of monocrystalline growth substrate 1, an LED 2 is epitaxially grown (see FIG. 2 and FIG. 5).

For the monocrystalline growth substrate 1, one with a small difference in lattice constant from the LED and few defects is used. To ensure the crystal properties and homogeneity of the LED, and to increase the durability against the atmosphere during epitaxial growth, the monocrystalline growth substrate is preferably one of monocrystalline sapphire, monocrystalline silicon carbide, monocrystalline GaAs and monocrystalline Si. The thickness of the monocrystalline growth substrate is preferably 0.1 to 1.0 mm. Additionally, to reduce the difference in lattice constant with the LED, monocrystalline growth substrate 1 preferably has, on a surface thereof, a buffer layer 11 composed of one of GaN, GaAs and GaP. The thickness of the buffer is preferably 0.1 to 0.8 μm. Additionally, in order to make the lattice constant of the monocrystalline growth substrate as close to that of the LED as possible, monocrystalline growth substrate 1 preferably has, on a surface thereof, a surface coating layer 12 composed of at least one inorganic compound selected from AlN, SiC, GaN and GaAs. The thickness of the surface coating layer is preferably 0.1 to 0.8 μm.

While LED 2 is usually constituted by an n-type Group III-V semiconductor layer 21, a luminescent layer 22, and a p-type Group III-V semiconductor layer 23, the present invention is not limited thereby. Such an LED can be formed by epitaxial growth by, for example, metal organic chemical vapor deposition (MOCVD) or halide vapor phase epitaxy (HVPE). According to MOCVD, an LED with good crystal properties can be grown, and according to HVPE, since the speed of crystal growth is fast, an LED can be grown efficiently. In order to further improve the luminescence property of an epitaxially grown LED, the surface may be subjected to treatment such as etching or polishing. The thickness of the LED is preferably 0.6 to 15 μm. The thicknesses of n-type Group III-V semiconductor layer 21, luminescent layer 22, and p-type Group III-V semiconductor layer 23 are in general 0.3 to 10 μm, 0.1 to 0.5 μm and 0.3 to 10 μm respectively.

(Step b) This step is a step of manufacturing a joined body of LED 2 epitaxially grown on the monocrystalline growth substrate as described above and wafer 6 of the present invention. Specifically, after forming a reflective layer 3 consisting of a metal on a surface of p-type Group III-V semiconductor layer 23 of the LED (see FIG. 2), or after further forming a metal layer 31 on the surface of the reflective layer 3 as necessary (see FIG. 5), it is joined with the wafer of the present invention. The wafer of the present invention shall be described below. Joining is performed by forming reflective layer 3 consisting of a metal (or reflective layer 3 and metal layer 31) on a surface of the metal infiltrated ceramic composite 61 of the wafer of the present invention, or on the surface of thin metal layer 63 formed on a surface thereof, then bringing the reflective layer 3 portion (or metal layer 31 portion) into contact with the above reflective layer 3 or the above metal layer 31, and heating them. By heating them, the two reflective layers 3 (or two metal layers 31) become integrated and form one reflective layer 3 (or one reflective layer 3 and one metal layer 31) (see FIG. 6). Heating is preferably performed while applying pressure at 20 MPa or below. The heating temperature is selected from a range of 250 to 550° C. depending on the types of reflective layer 3, metal layer 31 of the reflective layer, and thin metal layer 63.

When reflective layer 3 and thin metal layer 63 are constituted by the same type of metal, metal layer 31 of the reflective layer is not necessarily required, but when they are constituted by dissimilar metals, the surface of reflective layer 3 preferably has a metal layer 31 of the reflective layer of the same type as thin metal layer 63. Vapor deposition or sputtering etc. is adopted to form reflective layer 3 and metal layer 31 of the reflective layer. The preferred metal species for these layers are indium, aluminum, gold, silver, and alloys thereof. In particular, reflective layer 3 and thin metal layer 63 are preferably constituted by the same type of metal species. With respect to the thicknesses of reflective layer 3 and metal layer 31 of the reflective layer, since adhesion may be reduced if they are extremely thick, they are preferably 0.5 to 10 μm each, and particularly preferably 0.5 to 2 μm each. Even with these thicknesses, the thickness of reflective layer 3 is preferably the same as the thickness of thin metal layer 63 or within 10% thereof. The thickness of thin metal layer 63 is as described above.

(Step c) This step is a step of removing monocrystalline growth substrate 1, buffer layer 11 and surface coating layer 12 from the above joined body. The removal of the monocrystalline growth substrate is performed by shining a laser, polishing or etching etc. from the side of the monocrystalline growth substrate. The buffer layer is removed by etching etc., and the surface coating layer is removed by a grinding process etc. The joined body is changed into an intermediate structure consisting of reference numbers 2, 3 (or 3 and 31) and 6 by this step.

Figure 6:
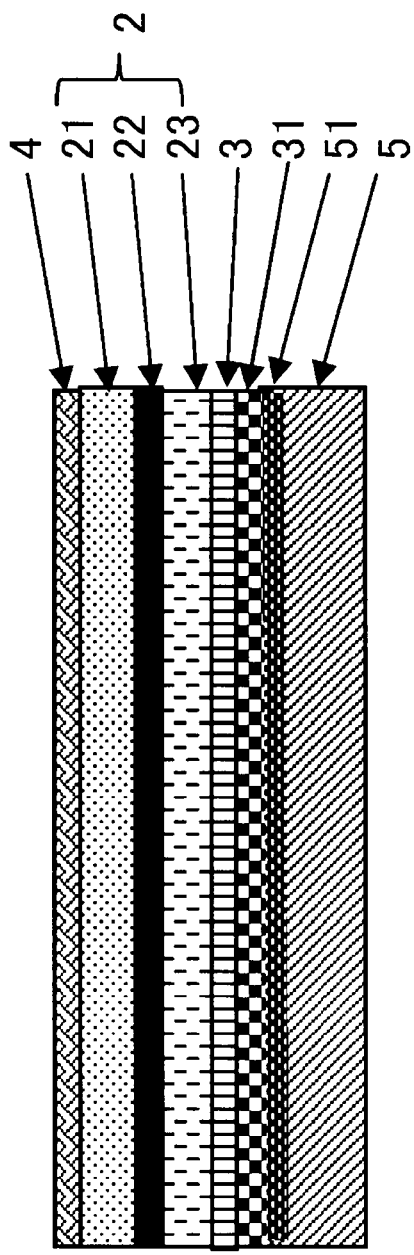
FIG. 6 is a diagram of an LED-mounted structure of the present invention manufactured from the joined body of FIG. 5.

(Step d) This step is a step of surface finishing the exposed n-type Group III-V semiconductor layer 21 of the above intermediate structure, then forming a transparent conductive layer 4 and an electrode (not shown) on the transparent conductive layer, and then cutting into a desired shape to manufacture the LED-mounted structure of the present invention (see FIG. 6). With the cutting, metal infiltrated ceramic composite 61 becomes substrate for LED mounting 5, and thin metal layer 63 becomes thin metal layer 51 on the surface of the substrate for LED mounting.

Surface finishing of n-type Group III-V semiconductor layer 21 is preferably performed by ICP dry etching to thereby flatten it to a surface suitable for the formation of a transparent conductive layer. The transparent conductive layer is formed to disperse electric current, and is formed by electron beam vapor deposition or sputtering etc. to have a thickness of 0.05 to 0.8 μm. The material of the transparent conductive layer is preferably at least one metal selected from indium tin oxide, cadmium tin oxide, indium zinc oxide, aluminum zinc oxide, tin zinc oxide and tin antimony oxide. Vapor deposition or sputtering is used to form the electrode. The material of the electrode is selected from Au, Ag and Al etc. Cutting is performed by laser cutting or dicing etc.

In the present invention, the LED-mounted structure of the present invention can be manufactured by initially cutting out at least a piece (i.e. substrate for LED mounting) from a part of the metal infiltrated ceramic composite, and operating according to the above steps using the piece (though the cutting operation of step d will not be necessary). However, when considering productivity, manufacture by the above steps is preferred.

Next, the wafer of the present invention and the manufacture method thereof shall be explained.

Wafer 6 of the present invention is constituted by metal infiltrated ceramic composite 61 and protective layer 62 formed around it. LED is mounted on at least one piece cut out from a part of the above metal infiltrated ceramic composite, i.e. on substrate for LED mounting 5. From this point of view, the wafer of the present invention functions as a base material for the substrate for LED mounting.

First, metal infiltrated ceramic composite 61 shall be explained. The necessary requirements of a substrate for LED mounting are: (a) having a strength that can endure the joining of a monocrystalline growth substrate on which the LED is epitaxially grown and the substrate for LED mounting, (b) the joining surface being flat without any pore or inclusion of foreign substances on the joining surface, (c) having good heat dissipation, and (d) having appropriate thermal conductivity and thermal expansion coefficient. (a) can be satisfied by making the three-point bending strength of the metal infiltrated ceramic composite at least 50 MPa, (b) can be satisfied by making the surface roughness (Ra) 0.01 to 0.5 μm, (c) can be satisfied by making the plate thickness of the metal infiltrated ceramic composite 0.05 to 0.5 mm, and (d) can be satisfied by using a metal infiltrated ceramic composite manufactured by impregnating a porous ceramic body or a ceramic powder compact comprising at least one selected from silicon carbide, aluminum nitride, silicon nitride, diamond and graphite and having a porosity of 10 to 50 volume % with a metal.

For the metal infiltrated ceramic composite, the preferred types of metals for impregnation are aluminum alloys in which aluminum is the main component, the particularly preferred three-point bending strength is 200 to 400 MPa, the particularly preferred surface roughness (Ra) is 0.01 to 0.2 μm, the particularly preferred plate thickness is 0.08 to 0.3 mm, and the particularly preferred porosity of the above porous ceramic body is 15 to 35 volume %. Additionally, the preferred thermal conductivity of the metal infiltrated ceramic composite is 150 to 500 W/mK (at a temperature of 25° C.). Moreover, the preferred thermal expansion coefficient is 4 to $9 \times 10^{-6}$/K (from a temperature of 25° C. to 150° C.), and the particularly preferred thermal expansion coefficient is 4.5 to $8 \times 10^{-6}$/K (from a temperature of 25° C. to 150° C.). In addition, the preferred volume resistivity of the metal infiltrated ceramic composite is less than $10^{-5}$ Ω·m.

When the three-point bending strength of the metal infiltrated ceramic composite is less than 50 MPa, it may not withstand the stress generated at each step of the manufacture of the LED-mounted structure. When the surface roughness (Ra) is less than 0.01 μm, processing is difficult, which is associated with increased costs, and when it exceeds 0.5 μm, the adhesion with LED may decrease. When the plate thickness is less than 0.05 mm, handling at each step of the manufacture of the LED-mounted structure is difficult, and when it exceeds 0.5 mm, the costs of processing into a final shape increase. When the porosity of the above porous ceramic body is less than 10 volume % (the metal being less than 10 volume %), thermal conductivity is small, and when it exceeds 50 volume % (the metal exceeding 50 volume %), the thermal expansion coefficient of the metal infiltrated ceramic composite may be large.

When the thermal expansion coefficient of the metal infiltrated ceramic composite (from a temperature of 25° C. to 150° C.) is outside the range of 4 to $9 \times 10^{-6}$/K, warping may occur after joining due to the difference in thermal expansion coefficient with the LED, and when used as an LED-mounted structure, peeling may occur to the joined layer, and further, the LED may crack. Additionally, when the thermal conductivity (at a temperature of 25° C.) is less than 150 W/mK, heat generated in the LED cannot be sufficiently dissipated, and in particular, for high-output LEDs where a large electrical current passes through, the temperature of the LED increases, luminescent efficiency decreases, and in connection therewith, the lifespan of the elements may decrease. While it may exceed 500 W/mK, the wafer will be expensive. When the volume resistivity is $10^{-5}$ Ω·m or higher, luminescent efficiency may decrease. When considering the ease of accessibility of the materials, the lower limit of the volume resistivity is preferably $10^9$ Ω·m.

The three-point bending strength of the metal infiltrated ceramic composite can be increased or decreased by the granularity and content of silicon carbide, aluminum nitride, silicon nitride, diamond and graphite, and the surface roughness (Ra) and plate thickness can be increased or decreased by processing conditions. The thermal conductivity and thermal expansion coefficient can be increased or decreased by the porosity of the above porous ceramic body or of the above ceramic powder compact, and the type and content of the metal. The volume resistivity can be increased or decreased by the type and content of the metal for impregnation.

Since the metal infiltrated ceramic composite itself has conductivity, an electrode can be easily formed on the LED. While for a monocrystalline growth substrate such as a sapphire substrate, the upper portion of the LED needs to be removed by etching etc. before forming an electrode on the same side, this operation is not needed when using a piece cut out from the metal infiltrated ceramic composite (substrate for LED mounting). As a result thereof, the amount of luminescence per unit area of the LED can be increased.

The substrate for LED mounting (i.e. a piece cut out from a part of the metal infiltrated ceramic composite of the wafer of the present invention) 5 preferably has excellent chemical resistance in addition to the above requirements (a) to (d). Here, chemical resistance refers to weight reduction per unit area that, when immersed for 1 minute in a 5N HCl solution at a temperature of 25° C. or in a 10N NaOH solution at a temperature of 75° C., is at most 0.2 mg/cm$^2$, particularly at most 0.1 mg/cm$^2$ for either chemical. When weight reduction exceeds 0.2 mg/cm$^2$, the metal component of the substrate for LED mounting may elute during the process of manufacturing the LED-mounted structure, decreasing thermal conductivity etc., and problems such as chipping when cutting into a predetermined shape using laser cutting or dicing etc. and reduced yield of the LED-mounted structure may occur.

The chemical resistance may be provided by forming a thin metal layer 51 on substrate for LED mounting 5. Additionally, since the sides of wafer 6 have a protective layer 62, when the protective layer is particularly at least one metal selected from Ni, Co, Pd, Cu, Ag, Au, Pt, Ti, W and Mo, or at least one ceramic having a porosity of at most 3% selected from aluminum nitride and silicon nitride, in particular alumina or mullite with a porosity of at most 3%, a particularly high chemical resistance is achieved.

The thickness of protective layer 62 is preferably at most 3 mm (not including 0) and the volume occupancy of the protective layer is preferably at most 20 volume % (not including 0). The lower limit of the thickness and the lower limit of the volume occupancy of the protective layer are not particularly limited, and it only needs to have a thickness that can protect the metal infiltrated ceramic composite from external factors such as impacts during processing. On the other hand, when the thickness exceeds 3 mm or when the volume occupancy exceeds 20 volume %, the part of the metal infiltrated ceramic composite of the wafer decreases, so the yield of the LED-mounted structure of the present invention decreases, and further, peeling may occur due to the thermal expansion coefficients of the metal infiltrated ceramic composite and the protective layer. The particularly preferred thickness of the protective layer is 0.002 to 2 mm, and the particularly preferred volume occupancy is 0.1 to 15 volume %.

The metal infiltrated ceramic composite may be manufactured by a method such as impregnation or powder metallurgy. A relatively higher thermal conductivity can be easily obtained by impregnation. Even for impregnation, there are methods performed under normal pressure and methods performed under a high pressure (high pressure forging), and high pressure forging includes liquid metal forging and die casting. For forming a protective layer around a metal infiltrated ceramic composite as in the present invention, liquid metal forging is particularly preferred. Moreover, liquid metal forging is a method in which a ceramic powder, a ceramic powder compact or a porous ceramic body is loaded in to a high pressure container, then the pore thereof are infiltrated with a molten metal such as an aluminum alloy under a high temperature and high pressure.

Herebelow, liquid metal forging (paragraphs [0040] to [0044]) shall be described in further detail.

From the aspects of high thermal conductivity and small thermal expansion coefficient, the ceramic is preferably at least one selected from silicon carbide, aluminum nitride, silicon nitride, diamond and graphite. Thermal conductivity and thermal expansion coefficient can be adjusted by the type of ceramic, the type of metal and the component ratio thereof.

While the ceramic, even in the form of a powder, can be composited with a metal, a ceramic powder compact made using a ceramic powder and, for example, a binder such as methyl cellulose or silica sol, or further, a porous ceramic body having a porosity of 10 to 50 volume % made by sintering the ceramic powder compact, is preferred. The shape is not particularly limited and may be a plate or cylinder etc. As the method for forming a ceramic powder compact, a general method for forming ceramic powder such as press molding or cast molding may be used. The porosity of the porous ceramic body may be adjusted by the granularity of the ceramic powder, molding pressure and sintering conditions etc.

Next, after loading at least one selected from a ceramic powder, ceramic powder compact and porous ceramic body into a metal or ceramic tubular body, one or more of the loaded products are fixed with a jig coated with a mold release agent. For example, a plurality of these loaded products may be stacked with mold release plates, such as stainless steel plates or ceramic plates coated with a mold release agent, in between, then connected using metal or ceramic bolts and nuts to form a stacked body. Graphite, boron nitride or alumina etc. may be used in the mold release agent.

After heating the resulting stacked body at a temperature of 600 to 800° C., one or more of which are placed in a high pressure container, a molten metal heated to the melting point or above is added and a pressure of at least 30 MPa is applied to impregnate the pore of at least one selected from a ceramic powder, ceramic powder compact and porous ceramic body with the metal. By doing so, a metal infiltrated ceramic composite is formed. Deformation during impregnation can be removed by subjecting the metal infiltrated ceramic composite to an annealing treatment. When the heating temperature is less than 600° C., or when the pressure during impregnation is less than 30 MPa, the thermal conductivity of the metal infiltrated ceramic composite may decrease. Additionally, when the temperature exceeds 800° C., oxidation may occur on the surface of the ceramic, and this may contribute to the thermal conductivity. An impregnation pressure of 50 to 150 MPa is particularly preferred.

The metal for impregnating the metal infiltrated ceramic composite is preferably an aluminum alloy, magnesium alloy, copper alloy or a silicon alloy. An aluminum alloy comprising at least 70 mass % of aluminum is particularly preferred. When the aluminum content is less than 70 mass %, the thermal conductivity does not greatly improve. Additionally, for sufficient penetration of the pore, the aluminum alloy preferably has a melting point that is as low as possible. An example of such an aluminum alloy is an aluminum alloy comprising 5 to 25 mass % of silicon. Moreover, the inclusion of at most 5 mass % of magnesium makes the bond between the ceramic and metal stronger and is thus preferred.

The resulting infiltrated product is processed using a lathe or cylindrical grinder etc., or if necessary, using a diamond whetstone, into a cylindrical shape where the tubular body surrounding the metal infiltrated ceramic composite is exposed. While the structure of the wafer is also adjusted by the dimensions of the inner diameter of the tubular body, the amount of grinding during this processing adjusts the dimensions of the outer diameter of the cylindrical body to adjust the final shape of the wafer. In other words, the thickness of the protective layer is determined by volume occupancy.

While the above method uses a tubular body as the protective layer, a separate method in which the pore of a porous ceramic body or ceramic powder compact are first infiltrated with a metal, and then a protective layer is formed on its sides may be used. In other words, after heating a ceramic powder compact or a porous ceramic body at a temperature of 600 to 800° C., one or two or more of which are placed in high pressure container, a molten metal heated to above the melting point is added and a pressure of at least 30 MPa is applied to impregnate the pore of the ceramic powder compact or porous ceramic body with the metal. The resulting infiltrated product is processed using a lathe or cylindrical grinder etc., or if necessary, by using a diamond whetstone, into a cylindrical body. Then at least one protective layer selected from Ni, Co, Pd, Cu, Ag, Au, Pt, Ti, W and Mo is formed around it (on the sides) by plating, vapor deposition or sputtering.

Then, after cutting the cylindrical body produced by any one of the above methods into a plate with a thickness that is approximately 0.1 to 0.5 mm thicker than the final shape of the wafer by a multi-wire saw or an ID blade cutter etc., the surface is finished to form the wafer of the present invention. That the wafer of the present invention may have a thin layer 63 of at least one metal selected from Ni, Co, Pd, Cu, Ag, Au, Pt and Sn was described above. While the cutting method is not particularly limited, multi-wire saws which have low cutting costs and are suitable for mass production are preferred. For surface finishing, it is preferred that a processing machine such as a double-sided grinder, rotary grinder, surface grinder or lapping machine be used to surface finish it to a plate thickness of 0.05 to 0.5 mm and a surface roughness (Ra) of 0.01 to 0.5 μm. When polishing the wafer of the present invention after joining it with an LED during the process of manufacturing an LED-mounted structure, it is possible to surface finish only one surface (the joining surface).

EXAMPLES

Example 1

Manufacture of Wafer

After mixing 1800 g of a commercially available silicon carbide (SiC) powder A (average particle diameter 200 μm), 900 g of a silicon carbide powder B (average particle diameter 20 μm), 300 g of a silicon carbide powder C (average particle diameter 2 μm), and 150 g of a mold binder (methyl cellulose, manufactured by Shin-Etsu Chemical Co., Ltd., "Metolose") in an agitating and mixing machine for 30 minutes, it was press molded at a surface pressure of 10 MPa into a cylindrical shape of dimensions of Φ55 mm×110 mm, then it was CIP molded at a molding pressure of 100 MPa to manufacture a molded body. After degreasing for 2 hours at a temperature of 600° C. in air atmosphere, it was fired for 2 hours at a temperature of 2100° C. under an argon atmosphere, then it was processed by a machining center using a diamond whetstone into a shape with external dimensions of Φ48.8 mm×100 mm to manufacture a porous ceramic body (porosity 20%).

After inserting this porous ceramic body into an alumina tube (outer diameter dimensions: Φ52.3 mm×100 mm, inner diameter dimensions: Φ49 mm×100 mm), it was inserted into a tubular graphite jig coated with a boron nitride mold release agent (external dimensions: 70 mm×70 mm×100 mm, inner diameter dimensions: Φ52.5 mm×100 mm) to form a structure. Four of these structures were stacked with mold release plates (stainless steel plates of 70 mm×100 mm×0.8 mm coated with a graphite mold release agent) in-between, 12 mm-thick iron plates were placed on two sides, and they were connected with eight bolts to form one stacked body (140.8 mm×140.8 mm×100 mm).

After preheating the stacked body to a temperature of 700° C. in an electric furnace, it was stored in a pre-heated press mold (inner diameter Φ400 mm×300 mm), a molten aluminum alloy (alloy composition: Si 12 mass %, Mg 1 mass %, Al 87 mass %, and temperature: 800° C.) was poured into it, and a pressure of 100 MPa was applied for 25 minutes to impregnate it with the aluminum alloy. After cooling it to room temperature, the mold release plates were stripped using a wet bandsaw along the shape of the mold release plates, and after removing the graphite jig portion by a lathe, a 3-hour annealing treatment was performed at a temperature of 530° C., deformation was removed, and an infiltrated product (a cylindrical body of Φ52 mm×100 mm) was manufactured.

From this infiltrated product, a test piece for measuring thermal expansion coefficient (Φ3 mm×10 mm), a test piece for measuring thermal conductivity (25 mm×25 mm×1 mm), a test piece for measuring three-point bending strength (3 mm×4 mm×40 m), and a test piece for measuring volume resistivity (40 mm×40 mm×5 mm) were cut out by a grinding process, and thermal expansion coefficient from a temperature of 25° C. to 150° C. was measured by a thermal expansion meter (manufactured by Seiko Instruments Inc.; TMA 300), thermal conductivity at a temperature of 25° C. was measured by laser flashing (manufactured by Ulvac; TC3000), three-point bending strength was measured by a bending strength tester, and volume resistivity was measured by the four-point probe method (in accordance with JIS R1637). The results were that the thermal expansion coefficient was $5.1 \times 10^{-6}$/K, the thermal conductivity was 250 W/mK, the three-point bending strength was 350 MPa and the volume resistivity was $8 \times 10^{-7}$ Ω·m (Table 1).

After outer periphery processing the above infiltrated product into a shape of Φ50.8 mm×100 mm by a cylindrical grinder using a diamond whetstone, it was cut into a disk with a plate thickness of 0.3 mm by a multi-wire saw using diamond grains at a slicing speed of 0.2 mm/min. After grinding the disk by a double-sided grinder using a #600 diamond whetstone to a plate thickness of 0.22 mm, it was polished to a plate thickness of 0.2 mm by a lapping machine using diamond grains, then it was subjected to supersonic cleansing in pure water and then in isopropyl alcohol and dried to manufacture a wafer of the present invention (see FIG. 1).

<Characteristics of Wafer>

This wafer 6 consists of a center portion of a metal infiltrated ceramic composite 61 and an alumina protective layer 62 around it (see FIG. 1). The surface roughness (Ra) measured by a surface roughness meter was 0.08 μm, the thickness of the alumina protective layer measured by an industrial microscope was 0.9 mm, and the volume occupancy of the protective layer was 7.0%.

Figure 4:
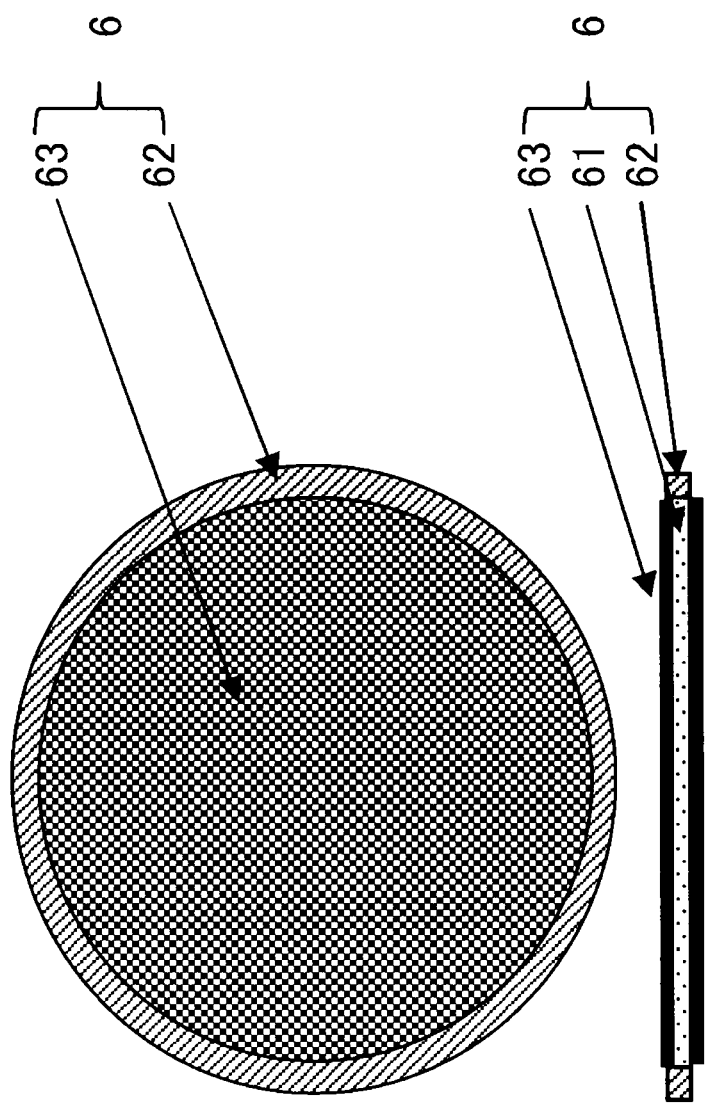
FIG. 4 is a diagram of a wafer of the present invention manufactured in Example 26.

Additionally, a thin metal layer 63 (0.5 μm-thick Au layer) was formed by vapor deposition on the top and bottom surfaces of the wafer (see FIG. 4), and chemical resistance was evaluated. Chemical resistance was measured by immersing for 1 minute in a 5N HCl solution at a temperature 25° C., then washing with distilled water, further immersing for 1 minute in a 10N NaOH solution at a temperature of 75° C., then washing with water, measuring the mass, and calculating weight reduction per unit area. The result was 0.01 mg/cm$^2$.

<Manufacture of LED-Mounted Structure>

Figure 2:
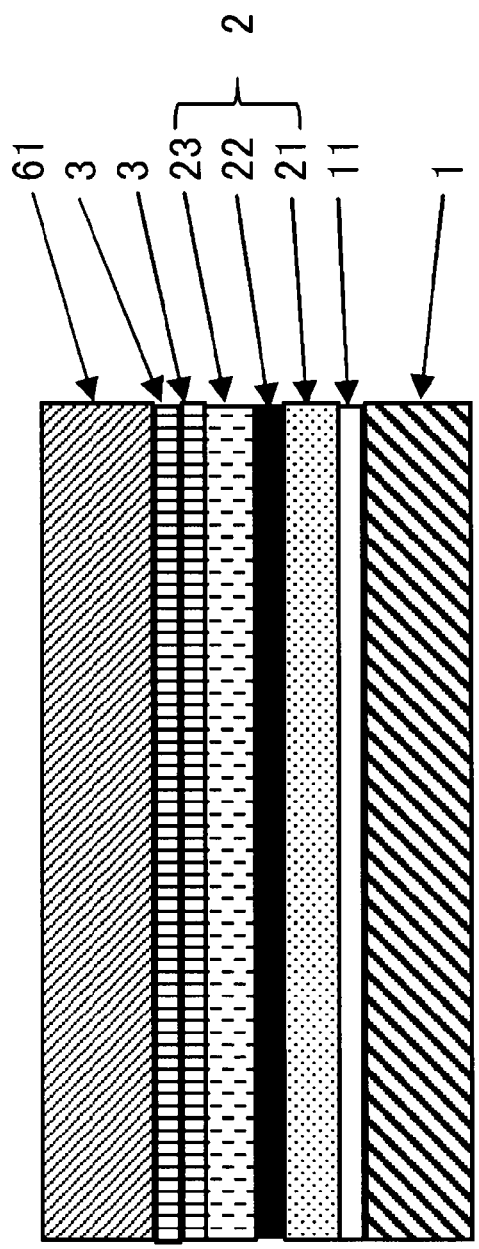
FIG. 2 is a diagram of a joined body comprising the wafer of FIG. 1 and an LED.

As shown in FIG. 2, a 0.3 μm n-type Group III-V semiconductor buffer layer (n-type GaN buffer layer) 11 was formed on a monocrystalline growth substrate (monocrystalline sapphire substrate) 1 with a plate thickness of 0.5 mm by MOCVD at a temperature of 1100° C. using ammonia gas and trimethyl gallium and using a mixed gas of nitrogen and hydrogen as carrier gas, then a 4.1 μm LED 2 was epitaxially grown thereon. The LED was composed of 2 μm of an n-type Group III-V semiconductor layer (n-type GaN semiconductor layer) 21, 0.1 μm of a luminescent layer (GaN luminescent layer) 22, and 2 μm of a p-type Group III-V semiconductor layer (p-type GaN semiconductor layer) 23.

Next, a 2 μm-thick reflective layer 3 of a metal layer of a silver/tin alloy (Ag 3.5 mass %, Sn 96.5 mass %) was respectively vacuum vapor deposited on the surface of the p-type GaN semiconductor layer 23 of LED 2 and a surface of wafer 6 of the present invention manufactured above.

The above reflective layers 3 were stacked in contact with each other and kept for 5 minutes under a pressure of 5 MPa at a temperature of 400° C. The two reflective layers fused together to form one reflective layer 3. Monocrystalline sapphire substrate 1 was stripped from the resulting joined body from the side of the monocrystalline growth substrate (monocrystalline sapphire substrate) by shining a nitrogen gas laser with an output of 40 MW/cm$^2$. Additionally, by shining the laser, n-type GaN buffer layer 11 disintegrated into Ga and nitrogen, and the monocrystalline sapphire substrate was stripped by the nitrogen gas generated thereby. The joined body changed into an intermediate structure consisting of reference numbers 2, 3 and 6 by this step.

Figure 3:
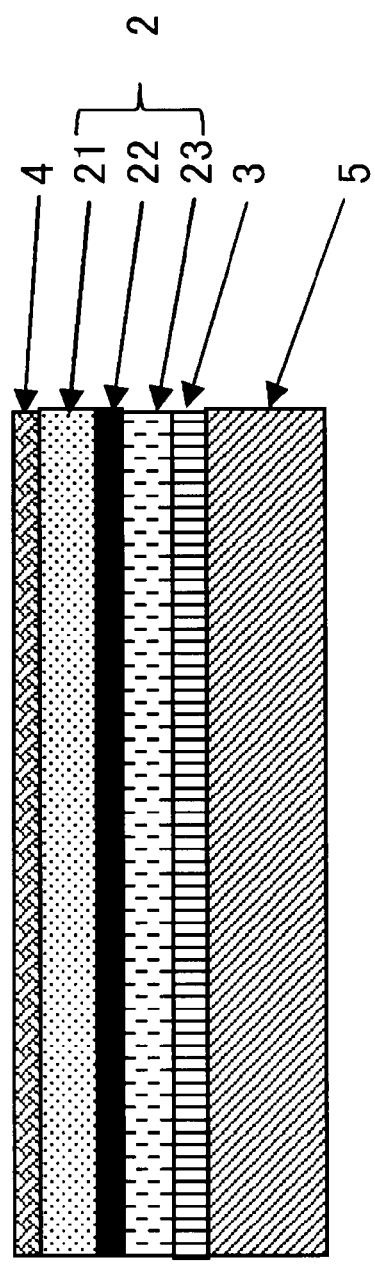
FIG. 3 is a diagram of an LED-mounted structure of the present invention manufactured from the joined body of FIG. 2.

Then, after removing the exposed n-type GaN buffer layer 11 by etching, a 0.4 μm-thick transparent conductive layer 4 of an indium tin oxide (Sn 4.5 mass %) was formed on the surface of LED 2. Then, after vapor depositing Au on the transparent conductive layer as an n-type electrode, it was cut to 1 mm×1 mm by dicing to manufacture a LED-mounted structure of the present invention (see FIG. 3, but the electrode is not shown).

Examples 2-5 and Comparative Examples 1-3

For Examples 2 and 3 and Comparative Examples 1 and 2, other than changing the cutting width during multi-wire saw processing and making various changes to the plate thickness, wafers were manufactured in a manner similar to that in Example 1. Moreover, for Examples 4 and 5 and Comparative Example 3, other than changing the granularity of the diamond particles during processing with a lapping machine and changing the surface roughness, wafers were manufactured in a manner similar to that in Example 1. Results thereof are shown in Table 1.

Examples 6-13

Thin layers 63 of various metals were formed on wafers manufactured in Example 1 (see FIG. 4), and chemical resistance was evaluated. Results thereof are shown in Table 2.

Examples 14-22

Porous ceramic bodies (porosity: 20%) manufactured in Example 1 were processed to have outer diameter dimensions shown in Table 3 by a machining center using a diamond whetstone. After each of these were inserted into a metal or ceramic tubular body (outer diameter dimensions: Φ52.3 mm×100 mm, inner diameter dimensions: Table 3), they were placed in tubular graphite jigs (external dimensions: 70 mm×70 mm×100 mm, inner diameter dimensions: Φ52.5 mm×100 mm) using a boron nitride mold release agent to form structures, and then subjected to operations until the annealing treatment in a manner similar to those in Example 1 to manufacture metal infiltrated ceramic composites. Then wafers having a shape of Φ50.8 mm×0.2 mm and a surrounding protective layer of a material corresponding to a metal or ceramic tubular body were manufactured in a manner similar to that in Example 1 from the metal infiltrated ceramic composites. Results thereof are shown in Table 3.

Example 23

Other than manufacturing a porous ceramic body having a porosity of 10% by degreasing a CIP molded body of Example 1 for 2 hours at a temperature of 600° C. in air atmosphere, and then firing it for 8 hours at a temperature of 2100° C. in an argon atmosphere, operations until the annealing treatment were performed in a manner similar to those in Example 1 to manufacture a metal infiltrated ceramic composite. The results were that the thermal expansion coefficient of the metal infiltrated ceramic composite was 4.6×10$^{-6}$/K, the thermal conductivity was 270 W/mK, the three-point bending strength was 320 MPa, and the volume resistivity was 1.6×10$^{-6}$ Ω·m. Then a wafer was manufactured in a manner similar to that in Example 1 from the metal infiltrated ceramic composite; however, the surface roughness (Ra) of the wafer was Ra 0.06 μm, the thickness of the alumina protective layer was 0.9 mm, the volume occupancy was 7.0% and the chemical resistance was 0.01 mg/cm$^2$.

Example 24

A mixed powder of 2000 g of a silicon carbide powder D (commercial product: average particle diameter 10 μm) and 300 g of silica sol (manufactured by Nissan Chemical Industries, Ltd.: Snowtex) was press molded into a cylindrical shape with dimensions of Φ52×100 mm at a surface pressure of 30 MPa to manufacture a molded body. Other than drying the resulting molded body for 1 hour at a temperature of 120° C., and then firing it for 2 hours at a temperature of 1400° C. in a nitrogen atmosphere to manufacture a porous ceramic body with a porosity of 50%, operations until the annealing treatment were performed in a manner similar to those in Example 1 to manufacture a metal infiltrated ceramic composite. The results were that the thermal expansion coefficient of the metal infiltrated ceramic composite was 9.5×10$^{-6}$/K, the thermal conductivity was 180 W/mK, the three-point bending strength was 500 MPa, and the volume resistivity was 3×10$^{-7}$ Ω·m. Then a wafer was manufactured in a manner similar to that in Example 1 from the metal infiltrated ceramic composite; however, the surface roughness (Ra) was Ra 0.09 μm, the thickness of the alumina protective layer was 0.9 mm, the volume occupancy was 7.0% and the chemical resistance was 0.02 mg/cm$^2$.

Example 25

Other than loading a mixed powder of 138 g of a silicon carbide powder D and 255 g of a silicon carbide powder E (commercial product: average particle diameter 150 μm) into an alumina tube (outer diameter dimensions: Φ52.3 mm×100 mm, inner diameter dimensions: Φ49 mm×100 mm) to form a ceramic powder compact (porosity: 35%), and then inserting it into a tubular graphite jig to form a structure, operations until the annealing treatment were performed in a manner similar to those in Example 1 to manufacture a metal infiltrated ceramic composite. The results were that the thermal expansion coefficient of the metal infiltrated ceramic composite was $7.5 \times 10^{-6}$/K, the thermal conductivity was 210 W/mK, the three-point bending strength was 400 MPa, and the volume resistivity was $5 \times 10^{-7}$ Ω·m. Then a wafer was manufactured from the metal infiltrated ceramic composite in a manner similar to that in Example 1; however, the surface roughness (Ra) was 0.08 μm, the thickness of the alumina protective layer was 0.9 mm, the volume occupancy was 7.0% and the chemical resistance was 0.01 mg/cm².

Example 26

A porous ceramic body manufactured in Example 1 was processed to a shape with external dimensions of Φ52 mm×100 mm by a machining center using a diamond whetstone, then it was coated with a boron nitride mold release agent and inserted into a tubular iron jig (external dimensions: 70 mm×70 mm×100 mm, inner diameter dimensions: Φ52.5 mm×100 mm) to form a structure. Four of these structures were stacked with mold release plates (70 mm×70 mm×0.8 mm stainless steel plates coated with a graphite mold release agent) in between to form a stacked body (140.8 mm×140.8 mm×100 mm), iron plates (12 mm thick) were placed on two sides thereof with ceramic boards (10 mm thick) in between, and connected with bolts. Then operations until the annealing treatment were performed in a manner similar to those in Example 1 to manufacture a metal infiltrated ceramic composite.

After outer periphery processing the resulting metal infiltrated ceramic composite into a cylindrical shape of Φ50.8 mm×100 mm by a cylindrical grinder using a diamond whetstone, the surface was cleaned, then the aluminum alloy portion on the surface was removed by etching using a NaOH solution, and non-electrolytic plating was performed to form a 10 μm-thick Ni—P plated layer. Then the cylindrical metal infiltrated ceramic composite was cut into a disk with a plate thickness of 0.3 mm by a multi-wire saw using diamond grains at a slicing speed of 0.2 mm/min. After grinding the disk-shaped metal infiltrated ceramic composite into a plate thickness of 0.22 mm by a double-sided grinder using a #600 diamond whetstone, it was polished to a plate thickness of 0.2 mm by a lapping machine using diamond grains, then it was subjected to supersonic cleansing in pure water and then in isopropyl alcohol and dried to manufacture a wafer 6 consisting of a center portion of a metal infiltrated ceramic composite 61 and a protective layer 62 of a metal layer (Ni) around it (see FIG. 1). The surface roughness (Ra) of the wafer was Ra 0.09 μm, the thickness of the Ni protective layer was 0.01 mm, the volume occupancy was 0.04% and the chemical resistance was 0.01 mg/cm².

<Manufacture of LED-Mounted Structure>

Figure 5:
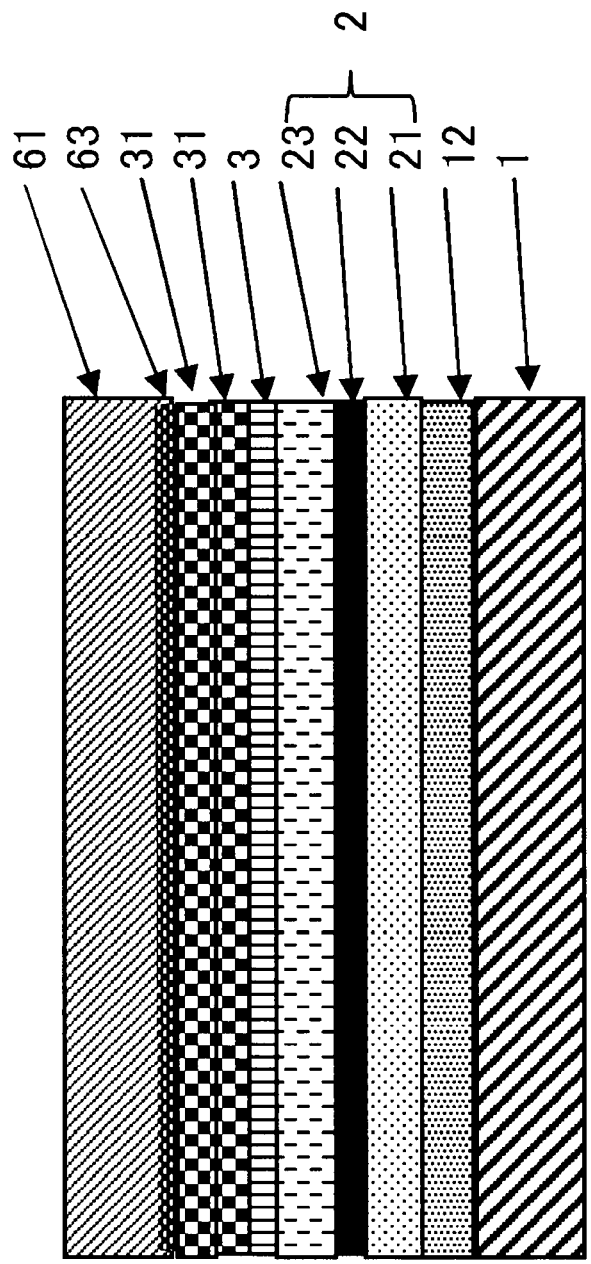
FIG. 5 is a diagram of a joined body comprising the wafer of FIG. 4 and an LED.

As shown in FIG. 5, after forming a 2 μm surface coating layer 12 consisting of SiC by CVD on a monocrystalline growth substrate (monocrystalline sapphire substrate) 1 with a plate thickness of 0.5 mm, a 4.1 mm-thick LED 2 was epitaxially grown by HVPE at a temperature of 1050° C. using ammonia gas and gallium chloride and using hydrogen gas as a carrier gas. LED 2 was composed of 2 μm of an n-type Group III-V semiconductor layer (n-type GaN semiconductor layer) 21, 0.1 μm of a luminescent layer (GaN luminescent layer) 22 and 2 μm of a p-type Group III-V semiconductor layer (p-type GaN semiconductor layer) 23.

Next, after forming a reflective layer 3 by vapour depositing silver to a thickness of 0.5 μm by vacuum vapour deposition on the surface of p-type Group III-V semiconductor layer 23 of LED 2, an Au/tin alloy (Au 80 mass %, Sn 20 mass %) was vapour deposited to a thickness of 1.5 μm to form a metal layer 31. A metal layer 31 was formed on a surface of wafer 6 manufactured above by vapour depositing an Au/tin alloy to a thickness of 1.5 μm. The two metal layers 31 were stacked facing each other and kept for 5 minutes under a pressure of 5 MPa at a temperature of 500° C. to manufacture a joined body. The two metal layers 31 fused to form one metal layer 31 by this step.

After removing monocrystalline growth substrate (monocrystalline sapphire substrate) 1 by etching by acid treatment of the resulting joined body, surface coating layer 12 was completely removed by a grinding process. After roughening the exposed surface of LED 2 by etching, a 0.2 μm-thick transparent conductive layer 4 of indium tin oxide (Sn 4.5 mass %) was formed. Then Au was vapour deposited as an n-type electrode, and laser processing was performed to manufacture a LED-mounted structure (see FIG. 6, but the electrode is not shown).

Example 27

Other than using an isotropic graphite compact (manufactured by Tokai Carbon Co., Ltd.: G458, porosity: 13 volume %, dimensions: 100 mm×100 mm×100 mm) as a porous ceramic body and stainless steel plates (100 mm×100 mm×0.8 mm) coated with graphite mold release material as mold release plates, operations until the annealing treatment were performed in accordance with Example 1 to manufacture a metal infiltrated ceramic composite. The thermal expansion coefficient of the metal infiltrated ceramic composite was $5.5 \times 10^{-6}$/K, the thermal conductivity was 250 W/mK, the three-point bending strength was 60 MPa, and the volume resistivity was $1.5 \times 10^{-7}$ Ω·m.

After cutting the metal infiltrated ceramic composite with a diamond saw, it was outer periphery processed to a cylindrical shape of diameter 50.8 mm×100 mm by a cylindrical grinder using a diamond whetstone, and a wafer having a protective layer of a metal layer (Ni) around it was manufactured in a manner similar to that in Example 26. The surface roughness (Ra) of the wafer was 0.15 μm, the thickness of the Ni protective layer was 0.01 mm, the volume occupancy was 0.04 and the chemical resistance was 0.02 mg/cm².

Example 28

After press molding a mixed powder of 2880 g of an aluminum nitride powder (average particle diameter 2 μm), 120 g of an yttria powder (average particle diameter 1 μm), 150 g of a mold binder (methyl cellulose) and 150 g of pure water at a surface pressure of 10 MPa, it was further CIP molded at a molding pressure of 100 MPa to manufacture a CIP molded body (diameter 55 mm×110 mm). After degreasing for 2 hours at a temperature of 600° C. in air atmosphere, it was fired for 4 hours at a temperature of 1780° C. under a nitrogen atmosphere to manufacture a sintered body, then a porous ceramic body (diameter 52 mm×100 mm) with a porosity of 22% was manufactured by a machining center using a diamond whetstone. Other than using this porous ceramic body and using pure aluminum instead of an aluminum alloy, operations until the annealing treatment were performed in accordance with Example 1 to manufacture a metal infiltrated ceramic composite. The thermal expansion coefficient of the metal infiltrated ceramic composite was $5.3 \times 10^{-6}$/K, the thermal conductivity was 180 W/mK, the three-point bending strength was 420 MPa, and the volume resistivity was $7.5 \times 10^{-7}$ Ω·m. Then a wafer was manufactured in a manner similar to that in Example 27 from the metal infiltrated ceramic composite. The surface roughness (Ra) of the wafer was 0.07 μm, the thickness of the Ni protective layer was 0.01 mm, the volume occupancy was 0.04% and the chemical resistance was 0.01 mg/cm$^2$.

Example 29

Other than using a mixture of 2790 g of a silicon nitride powder (average particle diameter 1 μm), 150 g of an yttria powder (average particle diameter 1 μm) and 60 g of a magnesium oxide powder (average particle diameter 1 μm), a CIP molded body was manufactured in a manner similar to that in Example 28. After firing it for 4 hours at a temperature of 1880° C. under a 0.9 MPa pressurized nitrogen atmosphere to manufacture a sintered body, a porous ceramic body (diameter 52 mm×100 mm) with a porosity of 13% was manufactured by a machining center using a diamond whetstone. Then a metal infiltrated ceramic composite and a wafer were manufactured in a manner similar to those in Example 28. The thermal expansion coefficient of the metal infiltrated ceramic composite was $4.0 \times 10^{-6}$/K, the thermal conductivity was 150 W/mK, the three-point bending strength was 450 MPa and the volume resistivity was $1.1 \times 10^{-6}$ Ω·m. Additionally, the surface roughness (Ra) of the wafer was Ra 0.09 μm, the thickness of the Ni protective layer was 0.01 mm, the volume occupancy was 0.04% and the chemical resistance was 0.01 mg/cm$^2$.

Example 30

7 g of a diamond powder A (manufactured by Diamond Innovations, Inc., MBG-600, average particle diameter: 120 μm) and 3 g of a diamond powder B (manufactured by Diamond Innovations, Inc., MBG-600, average particle diameter: 15 μm) were mixed for 10 minutes in an alumina mortar. After inserting a tubular graphite jig Y (external dimensions: diameter 52.4 mm×9 mm) into a graphite jig X (external dimensions: 70 mm×70 mm×20 mm, inner diameter dimensions: diameter 52.5 mm×20 mm), 10 g of the above mixed diamond powder was loaded therein, a graphite jig Y was further inserted on the top side of the mixed diamond powder to form a ceramic powder compact with a porosity of 35%. The ceramic powder compact was made into a stacked body, which was subjected to an impregnation treatment in accordance with Example 1 to manufacture a metal infiltrated ceramic composite (70 mm×70 mm×20 mm) surrounded by a tubular graphite jig. The thermal expansion coefficient of the metal infiltrated ceramic composite was $7.5 \times 10^{-6}$/K, the thermal conductivity was 500 W/mK, the three-point bending strength was 320 MPa, and the volume resistivity was $5 \times 10^{-7}$ Ω·m.

Next, until the metal infiltrated ceramic composite was exposed, a grinding process was performed by a surface grinder using a diamond whetstone from the two main sides (70 mm×70 mm) to process it into a plate-shaped body (70 mm×70 mm×3 mm). After outer periphery processing it by a water jet machine to a disk shape (diameter 50.8 mm×3 mm), the surface was cleaned, then the aluminum alloy portion on the surface was removed by etching using a NaOH solution, and non-electrolytic plating was performed to form a 10 μm-thick Ni—P plated layer, then the two main surfaces of the metal infiltrated ceramic composite were subjected to a grinding process by a surface grinder using a diamond whetstone to manufacture a wafer having a protective layer of a metal layer (Ni) around it. The surface roughness (Ra) of the wafer was 0.3 μm, the thickness of the Ni protective layer was 0.01 mm, the volume occupancy was 0.04% and the chemical resistance was 0.01 mg/cm$^2$.

Example 31

A porous ceramic body (external dimensions: diameter 52 mm×height 100 mm, porosity: 20%) of Example 1 was processed into a disk with external dimensions of diameter 52 mm×20 mm by a machining center using a diamond whetstone. The disk and a lump of silicon were placed in a graphite crucible coated with a BN powder, and set inside an electric furnace. The inside was vacuumed and kept for 8 hours at 1650° C. to impregnate it with silicon. After cooling to room temperature, excess silicon was removed by a cylindrical grinder to manufacture a metal infiltrated ceramic composite. The thermal expansion coefficient of the metal infiltrated ceramic composite was $4.3 \times 10^{-6}$/K, the thermal conductivity was 210 W/mK, the three-point bending strength was 250 MPa, and the volume resistivity was $1 \times 10^{-5}$ Ω·m. Then a wafer was manufacture in a manner similar to that in Example 26. The surface roughness (Ra) of the wafer was 0.15 μm, the thickness of the Ni protective layer was 0.01 mm, the volume occupancy was 0.04% and the chemical resistance was 0.005 mg/cm$^2$.

TABLE 1

| | Plate Thickness (mm) | Surface Roughness (Ra) (μm) | Thickness of Protective Layer (mm) | Volume Occupancy of Protective Layer (volume %) | Decrease in Mass (mg/cm$^2$) |
|---|---|---|---|---|---|
| Example 1 | 0.2 | 0.08 | 0.9 | 7.0 | 0.01 |
| Example 2 | 0.05 | 0.08 | 0.9 | 7.0 | 0.02 |
| Example 3 | 0.5 | 0.08 | 0.9 | 7.0 | 0.01 |
| Example 4 | 0.2 | 0.01 | 0.9 | 7.0 | 0.01 |
| Example 5 | 0.2 | 0.5 | 0.9 | 7.0 | 0.03 |
| Comparative Example 1 | 0.02 | 0.09 | 0.9 | 7.0 | 0.2 |
| Comparative Example 2 | 1 | 0.1 | 0.9 | 7.0 | 0.01 |
| Comparative Example 3 | 0.2 | 1 | 0.9 | 7.0 | 0.1 |

TABLE 2

| | Method for Forming Metal Layer | Type of Metal | Thickness of Thin Metal Layer (μm) | Decrease in Mass (mg/cm$^2$) |
|---|---|---|---|---|
| Example 6 | Plating | Ni | 2 | 0.01 |
| Example 7 | Plating | Ni + Au | 3 | 0 |
| Example 8 | Vapor Deposition | Co | 1 | 0 |
| Example 9 | Vapor Deposition | Pd | 1 | 0.01 |
| Example 10 | Vapor Deposition | Cu | 1 | 0.02 |
| Example 11 | Vapor Deposition | Ag | 1 | 0.01 |
| Example 12 | Vapor Deposition | Pt | 1 | 0 |
| Example 13 | Sputtering | Au | 1 | 0 |

TABLE 3

| | Material of Tubular Body | Inner Dimensions of Tubular Body (mm) | Outer Dimensions of Porous Ceramic Body (mm) | Surface Roughness (Ra) (μm) | Thickness of Protective Layer (mm) | Volume Occupancy of Protective Layer (volume %) | Decrease in Mass (mg/cm²) |
|---|---|---|---|---|---|---|---|
| Example 14 | Alumina | 50.4 | 50.2 | 0.08 | 0.2 | 1.6 | 0.02 |
| Example 15 | Alumina | 45.4 | 45.2 | 0.08 | 2.7 | 20 | 0.01 |
| Example 16 | Mullite | 49.0 | 48.8 | 0.08 | 0.9 | 7.0 | 0.02 |
| Example 17 | Aluminum nitride | 49.0 | 48.8 | 0.08 | 0.9 | 7.0 | 0.01 |
| Example 18 | Silicon nitride | 49.0 | 48.8 | 0.08 | 0.9 | 7.0 | 0.01 |
| Example 19 | Ti | 49.0 | 48.8 | 0.08 | 0.9 | 7.0 | 0.01 |
| Example 20 | Mo | 49.0 | 48.8 | 0.08 | 0.9 | 7.0 | 0.02 |
| Example 21 | Ni | 49.0 | 48.8 | 0.08 | 0.9 | 7.0 | 0.01 |
| Example 22 | W | 49.0 | 48.8 | 0.08 | 0.9 | 7.0 | 0.02 |

The invention claimed is:

1. A wafer, comprising:
a metal infiltrated ceramic composite; and
a protective layer formed only around the circumference of the composite.

2. The wafer of claim 1, wherein the composite comprises at least one selected from the group consisting of silicon carbide, aluminum nitride, silicon nitride, diamond, and graphite, and is formed by a process comprising impregnating a porous body or a powder compact having a porosity of 10 to 50 volume % with a metal, and
the composite has a plate thickness of 0.05 to 0.5 mm, a surface roughness (Ra) of 0.01 to 0.5 μm, a three-point bending strength of at least 50 MPa, a thermal conductivity of 150 to 500 W/mK at a temperature of 25° C., a thermal expansion coefficient of 4 to $9 \times 10^{-6}$/K from a temperature of 25° C. to 150° C., and a volume resistivity of $10^{-9}$ to $10^{-5}$ Ω·m.

3. The wafer of claim 1, wherein the protective layer comprises at least one metal selected from the group consisting of Ni, Co, Pd, Cu, Ag, Au, Pt, Ti, W, and Mo, or at least one ceramic having a porosity of at most 3% selected from the group consisting of alumina, mullite, aluminum nitride, and silicon nitride, and the protective layer has a thickness of at most 3 mm (not including 0), and a volume occupancy of the protective layer is at most 20 volume % (not including 0).

4. The wafer of claim 1, wherein the composite comprises, on a surface, a thin metal layer having a thickness of 0.5 to 10 μm and comprising at least one metal selected from the group consisting of Ni, Co, Pd, Cu, Ag, Au, Pt, and Sn.

5. The wafer of claim 4, wherein the thin metal layer comprises at least one metal selected from the group consisting of Ni and Au.

6. The wafer of claim 1, wherein the protective layer has a thickness of 0.002 to 2 mm.

7. The wafer of claim 6, wherein a volume occupancy of the protective layer is from 0.1 to 15 volume %.

8. The wafer of claim 7, wherein the protective layer comprises at least one metal selected from the group consisting of Ni, Co, Pd, Cu, Ag, Au, Pt, Ti, W, and Mo.

9. The wafer of claim 8, wherein the protective layer comprises Ni.

10. The wafer of claim 8, wherein the protective layer comprises Ti.

11. The wafer of claim 8, wherein the protective layer comprises W.

12. The wafer of claim 8, wherein the protective layer comprises Mo.

13. The wafer of claim 1, wherein said protective layer surrounds and is in contact with a center portion consisting of said metal infiltrated ceramic composite.

14. The wafer of claim 13, wherein:
the metal infiltrated ceramic composite comprises at least one selected from the group consisting of silicon carbide, aluminum nitride, silicon nitride, diamond, and graphite, and is formed by a process comprising impregnating a porous body or a powder compact having a porosity of 10 to 50 volume % with a metal;
the metal infiltrated ceramic composite has a plate thickness of 0.05 to 0.5 mm, a surface roughness (Ra) of 0.01 to 0.5 μm, a three-point bending strength of at least 50 MPa, a thermal conductivity of 150 to 500 W/mK at a temperature of 25° C., a thermal expansion coefficient of 4 to $9 \times 10^{-6}$/K from a temperature of 25° C. to 150° C., and a volume resistivity of $10^{-9}$ to $10^{-5}$ Ω·m; and
the protective layer comprises at least one metal selected from the group consisting of Ni, Co, Pd, Cu, Ag, Au, Pt, Ti, W, and Mo, or at least one ceramic having a porosity of at most 3% selected from the group consisting of alumina, mullite, aluminum nitride, and silicon nitride, and the protective layer has a thickness of at most 3 mm (not including 0), and a volume occupancy of the protective layer is at most 20 volume % (not including 0).

15. A wafer, comprising:
a metal infiltrated ceramic composite; and
a protective layer around the composite,
wherein the protective layer has a thickness of 0.002 to 2 mm;
a volume occupancy of the protective layer is from 0.1 to 15 volume %; and
wherein the protective layer comprises at least one ceramic having a porosity of at most 3% selected from the group consisting of alumina, mullite, aluminum nitride, and silicon nitride.

16. The wafer of claim 15, wherein the protective layer comprises alumina.

17. The wafer of claim 15, wherein the protective layer comprises mullite.

18. The wafer of claim 15, wherein the protective layer comprises aluminum nitride.

19. The wafer of claim 15, wherein the protective layer comprises silicon nitride.

* * * * *